United States Patent [19]

Scott et al.

[11] 4,339,683
[45] Jul. 13, 1982

[54] ELECTRICAL CONNECTION

[75] Inventors: William R. Scott, Doylestown; Philip Bloomfield, Bala Cynwyd, both of Pa.; William T. Weist, Cherry Hill, N.J.; Karen M. McMahon, Southampton, Pa.

[73] Assignee: The United States of America as represented by the Secretary of the Navy, Washington, D.C.

[21] Appl. No.: 118,043

[22] Filed: Feb. 4, 1980

[51] Int. Cl.³ .............................................. H01L 41/08
[52] U.S. Cl. .................................... 310/364; 310/363; 310/800
[58] Field of Search ............... 310/363, 364, 800, 311; 29/25.35

[56] References Cited

U.S. PATENT DOCUMENTS

| 2,235,489 | 3/1941 | Rath | 310/363 X |
| 2,648,785 | 8/1953 | Tournier | 310/364 X |
| 2,657,320 | 10/1953 | Ziegler | 310/363 X |
| 3,948,089 | 4/1976 | Shaw et al. | 310/364 X |

FOREIGN PATENT DOCUMENTS 54-132187  10/1979  Japan ..................... 310/364

Primary Examiner—Mark O. Budd
Attorney, Agent, or Firm—R. S. Sciascia; Henry Hansen; Stanton D. Weinstein

[57] ABSTRACT

A mechanical and electrical connection for a piezoelectric member of polymeric material such as polyvinylidene fluoride, and method for forming such a connection. To form the connection, the piezoelectric member is first masked to prevent a preselected portion of its surface from being coated during subsequent coating operations. An electrically conductive member such as a lead wire or a solderable terminal is then attached to the nonmasked area of the piezoelectric member with adhesive such as epoxy. The masked piezoelectric member, the electrically conductive member, and (incidentally) the mask are then coated with a conductive coating such as sputtered gold to electrically connect the conductive member to the piezoelectric member. The mask can now be removed from the piezoelectric member if desired, although it can be left in place as a convenient vise. If the conductive member is a wire, adjacent portions of the wire and the piezoelectric member can now be coated with additional epoxy to provide heat dissipation for and protect the electrical connection provided by the conductive coating, and to insure mechanical strength of the contact. If the conductive member is a terminal strip or solderable terminal, a wire can now be soldered to the conductive coating at the terminal using low temperature solder. The solder joint can then be coated with silver-filled paint to produce a lower current density and lower contact resistance in the vicinity of the contact.

12 Claims, 6 Drawing Figures

ELECTRICAL CONNECTION

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to electrical connections and formation thereof, and more particularly to electrical connections and formation thereof usable on heat-sensitive substrates or members.

Polyvinylidene fluoride, also referred to as poly(vinylidene fluoride), $PVF_2$ or PVDF, has received considerable interest as a material for piezoelectric transducers in non destructive testing applications such as acoustic emission and ultrasonic pulse echo testing, particularly for aircraft components under fatigue test. Such transducers are less brittle than ceramic piezoelectric transducers, and have other highly desirable properties. For further information, see Robinson, A. L. *Flexible $PVF_2$Film: An Exceptional Polymer for Transducers.* In *Science.* 200 (4348): p. 1371-1374. June 23, 1978. Higher frequency transducers are needed to detect smaller critical flaws, but at frequencies of 20 MHz and above, ceramic piezoelectrics are thin and fragile, a problem not encountered with $PVF_2$. In addition, $PVF_2$ can function at higher power levels than many ceramic piezoelectric elements without suffering dielectric breakdown and subsequent failure. $PVF_2$ films have also been used as diaphragms for loudspeakers and earphones. However, there is a drawback to making an effective electrical connection to $PVF_2$ so that it can be used in such applications. One method that has been utilized in the attempt to overcome this problem has been to mechanically attach a lead wire via a spring clip to $PVF_2$ film thinly coated with vacuum deposited aluminum. Another method has been to attach a wire lead to such an aluminized $PVF_2$ film with electrically conductive silver-filled epoxy. However, such techniques suffer from various problems, including poor electrical interconnection, damage by mechanical contacts to film or aluminum coating, mechanical failure of lead attachment, and failure of adhesive to stick to aluminum metallization. Other problems encountered in use as an active device of such a transducer produced thereby include low current carrying capacity, burnout of the aluminum coating during normally anticipated service, arcing around points of contact and within such an adhesive conducting layer, anomalous beam patterns in the active transducer area near the lead attachment points, susceptibility of such contacts to corrosion, and bulkiness of such contacts. For the conductive adhesive connection, wherein the wire is lifted off the film, the poor dielectric strength of the adhesive and the presence of a high voltage across the epoxy can cause breakdown of the epoxy, thermal damage to the $PVF_2$, and damage to the connection. Since $PVF_2$ is temperature sensitive, and aluminum metallization applied thereto is thin, soldering a wire lead to aluminum metallization on a $PVF_2$ film can cause permanent damage to the metallization and film.

SUMMARY OF THE INVENTION

Accordingly, it is a general purpose of the present invention to provide structure and method capable of effecting reliable electrical interconnection between an electrically conductive member and another member.

Other objects of the present invention are to provide apparatus and method capable of providing strong, durable electrical connection, which have good current carrying capacity, good mechanical strength, do not burn out with normally expected use, need not be applied to previous metallization, do not adversely affect the device or member to which it is applied, and which are capable of reliable transfer of electrical signals therethrough.

Further objects of the present invention are to provide apparatus and method capable of providing a strong, durable electrical connection with low contact resistance, reducing localized heating at high electrical loads of the material to which the lead is attached, reducing arcing and electrical anomalies of that type to prevent resulant localized damage to the connected members from heating, reducing damage to metalization caused by arcing, providing thermal protection to heat-sensitive substrates to which the connection is applied, and preventing breakdown of the connection.

Still other objects of the present invention are to provide apparatus and method capable of providing soldered connections to a heat-sensitive member or device without damaging that member or device.

Still further objects of the present invention are to provide a piezoelectric transducer which is flexible and lightweight, having lead attachment points or electrical connections which are disposed away from the acoustically active area of the transducer to keep the field of the active area of the transducer away from acoustical or electrical anomalies produced by the lead attachment point(s), reducing anomalies in beam pattern, preventing arcing between plates of the transducer, preventing localized arcing near the surface of the transducer, and preventing breakdown of or damage to the connection or to the transducer material.

Briefly, these and other objects of the present invention are accomplished by an electrical and mechanical interconnection between a conductive member and a second member to or from which electrical signals are to be provided, and by a method for forming such interconnection. The interconnection includes adhesive material such as epoxy disposed between and attaching an electrically conductive member to a second member, and a single contiguous electrically conductive coating applied to adjacent portions of these two members to electrically connect them. The second member can be a heat-sensitive member such as a $PVF_2$ film. The second member need not necessarily be a conductive member; for example, $PVF_2$ film can be utilized in a transducer. The second member can first be partially masked to expose only those portions of the member which are to receive the conductive coating. To form the connection, one or more electrically conductive members, such as metallic wires or electrodes, are fixed to the second member with adhesive such as epoxy. Adjacent areas of the conductive member or members and of the second member are then coated with a contiguous conductive coating such as by sputtering gold thereon. Especially for a $PVF_2$ or second polymer piezoelectric transducer, the other member should be masked before coating, and then unmasked after applying the coating, where multiple connections are desired, to prevent arcing or undesirable interconnection between the coatings of the respective connections. Appropriate masking and positioning of the connection also keeps the field of the active area of the transducer away from electrical and acoustic anomalies produced by the connection(s).

Other objects, advantages and novel features of the invention will become apparent from the following detailed description of the invention when considered in conjunction with the accompanying drawings wherein:

DESCRIPTION OF THE PREFERRED EMBODIMENTS

Figure 1:
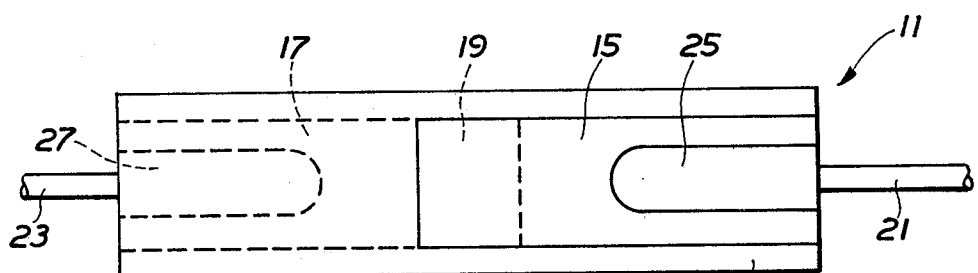
FIG. 1 is a plan view of a preferred embodiment of a piezoelectric transducer according to the present invention and including electrical connections according to a preferred embodiment of the present invention.
Figure 2:
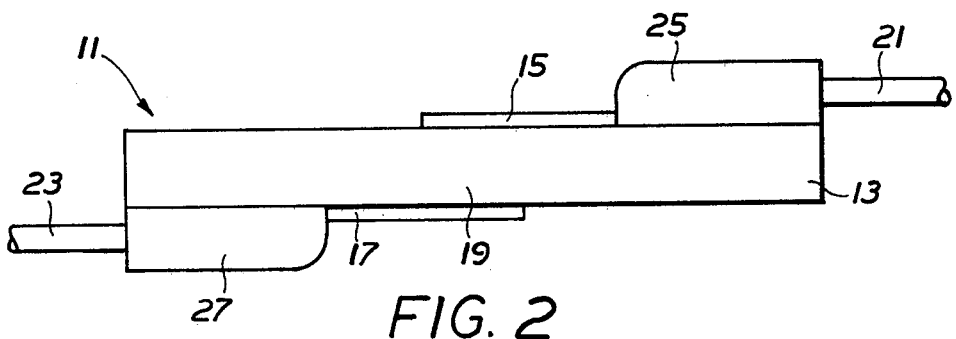
FIG. 2 shows a side elevation of the transducer of FIG. 1.

Referring now to the drawings, wherein like reference characters designate like or corresponding parts throughout the several views, there is shown in FIGS. 1 and 2 a transducer 11 including a strip of film of polyvinylidene fluoride ($PVF_2$) or other appropriate material 13 provided with conductive coatings 15 and 17 formed on opposite sides of the film and which are configured to form two thin metallic transducer plates. These two plates together define an active transducer area 19 immediately therebetween and bounded by the respective faces of the plates. Film 13 can for example be one inch long by 0.25 inch wide by 30 or 9 microns thick. Conductive coatings 15 and 17 are respectively connected to wire leads 21 and 23 via respective connections 25 and 27. Coatings 15 and 17 can for example each be of sputtered gold. Electrical signals can be provided to active area 19 via coatings 15 and 17 from respective wires 21 and 23 connected thereto. As can be more clearly seen in FIG. 1, a metallization-free border is provided about the edge of film 13 to prevent arcing between coating 15 and 17 about the edges of transducer 11. Also, active transducer area 19 is displaced from the area of connections 25 and 27 to prevent electrical or acoustic anomalies about the connections from interfering with or appearing in the active area.

Figure 4:
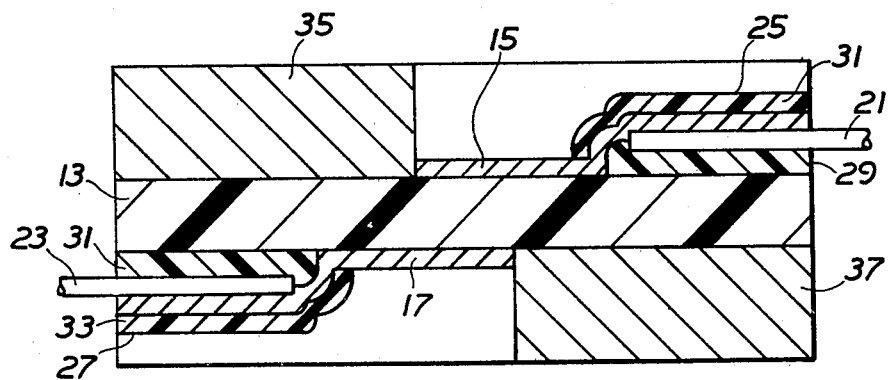
FIG. 4 shows an enlarged section of the transducer and masks taken along the line 4—4 of FIG. 3, with some portions shown exaggerated for clarity.

One preferred embodiment of a connection for connections 25 and 27 is shown in a sectional representation in FIG. 4. Each connection 25 and 27 includes a respective adhesive layer 29 or 31 such as of epoxy bonding respective wire 21 or 23 to film 13, and a respective metal or other conductive layer 15 or 17 such as of sputtered gold electrically connecting respective wire 21 or 23 to film 13. Each connection 25 and 27 can additionally be provided with an additional protective layer of adhesive 31 or 33 such as of epoxy to provide heat dissipation from, and ensure mechanical strength of the connection. Conductive layers 15 and 17 also serve as the transducer 11 plates, so that there is direct electrical connection between the respective plates and respective lead wires 21 and 23.

Figure 3:
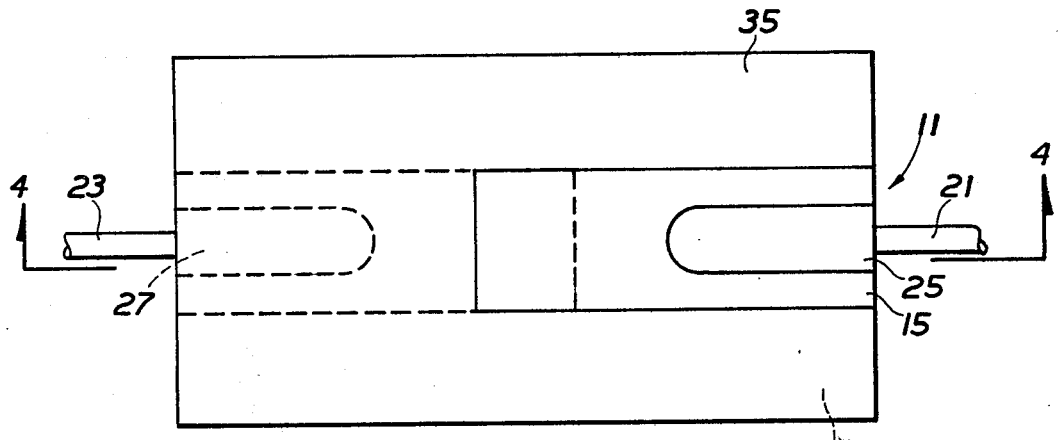
FIG. 3 shows a plan view of a transducer according to the present invention between two masks during one step of manufacture of the transducer and connections of FIG. 1.
Figure 5:
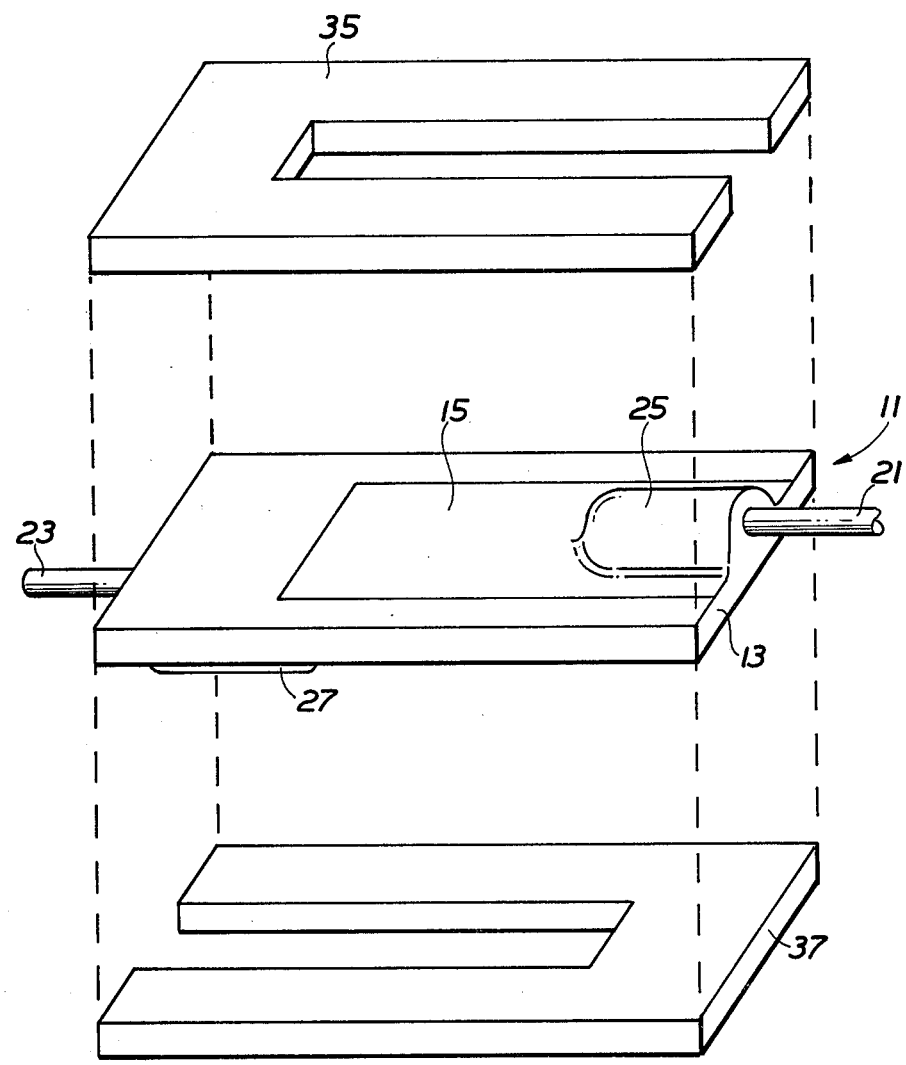
FIG. 5 is an exploded view of the transducer and masks of FIG. 3, showing the relative orientations thereof.

To form the connection of FIG. 4, the $PVF_2$ film 13 is first placed in a mask including upper mask 35 and lower mask 37, which partially covers both sides of film 13, as shown in FIGS. 3, 4 and 5. Masks 35 and 37 each cover one end and two side borders of film 13. $PVF_2$ film or foil usable as film 13 to produce transducer 11 is available from the Kureha Chemical Industry Company, Tokyo, but is supplied therefrom with an aluminum coating which should first be etched away using a sodium hydroxide solution, after which the film should be rinsed in distilled water and organic solvents such as methanol or acetone, and then dried before masking. Masks 35 and 37 together hold the mechanical shape of the film, provide a pattern on which to establish lead attachment points, and act as a mask in a subsequent metallization operation. Bare metallic lead wires 21 and 23 or other conductive members are then attached to the exposed extremities of foil or film 13 on respective opposite sides of the film. The attachment is done using a small quantity of epoxy adhesive or other adhesive 29 and 31 to cement respective wire 21 or 23 to film 13 in such a manner as to leave the upper portion of the wire exposed, such as is shown in FIG. 4. Continuous conductive metallic, preferably gold, coatings 15 and 17 each about 2,000 angstroms thick are then deposited through a sputtering or other vacuum metallization process. Metallization is deposited over each side of the masked film 13 including wires 21 and 23, and over masks 35 and 37. This can be accomplished by applying the metallic film to one side of film 13 at a time. The temperature of the film 13 should be kept relatively low (below 170°-200° F.) during deposition of coatings 15 and 17 to prevent degradation of film 13. On each side of transducer 11, there now exists a continuous metallic bond between respective film 15 or 17, part of each of which constitutes an electrode of the transducer, and the corresponding contact 25 or 27 (including the lead wire or respective lead wire 21 or 23) onto which the gold or other metal is deposited. Excellent ohmic contact between transducer 11, its respective electrodes, and respective lead wires 21 and 23 is thus achieved and maintained during use. Masks 35 and 37 can now be removed from the completed transducer 11. FIG. 5 shows the respective orientation of masks 35 and 37 and connections 25 and 27 during construction of transducer 11. Before or after unmasking of transducer 11, a protective layer of additional epoxy or other adhesive or other hardening, protective, conforming coating can then be placed over metallic layer 15 and metallic layer 17 and 31 and respective wires 21 and 23 to protect the electrical contact thus formed, to provide better heat dissipation via the solid protective layer, and to ensure mechanical strength of the contact to produce connections 25 and 27 shown in FIG. 4. However, it is preferred that this protective layer be applied after removal of masks 35 and 37. After the above manufacture has been completed, the film 13 of FIGS. 3, 4 and 5 is trimmed to the illustrative dimensions given above for transducer 11.

Masks 35 and 37 can be of any suitable solid material such steel or cardboard. It may be desired to produce more than one transducer 11 in a single metallization operation. For example, two identically shaped pieces of steel each 3 inches long by 1 inch wide by 0.125 inch thick, and each provided at one long edge with 9 parallel equidistant notches each 0.1875 inch wide by 0.625 inch long to form a comb-like member, can be used together as masks 35 and 37 to produce as many as nine transducers 11 each having the illustrative dimensions given above. These two masks can then be held together, one mask reversed over the other, at the two short sides thereof with appropriate fasteners such as spring loaded metal clips such as are commonly used to hold papers together. Polymer film or foil is sandwiched between these masks for fabrication of transducers. As another example, masks 35 and 37 can be replaced with a single sheet of cardboard folded once and provided with appropriate openings to accommodate the number of transducers required. For example, a piece of thin cardboard 6 inches long by 3.825 inches wide can be folded in half across its length. This mask is provided with a single rectangular opening 2.3125 inches long by 0.4375 inch wide having one long edge parallel to and spaced 0.25 inch away from the fold. This cardboard mask is provided on the other side of the fold with eight parallel substantially equidistantly spaced rectangular holes each 0.5265 inch long by 0.1875 inch wide having their long edges parallel to the length of the cardboard and having their respective nearest edges spaced 0.25 inch from the fold. These eight smaller holes are so disposed on the mask that when the mask is folded over, the large hole will expose a portion of each of the eight smaller holes. The eight smaller holes are located on the mask within a 2.375 inches long by 0.5625 inch wide space disposed parallel to but opposite from the large hole on the other side of the fold. A single piece of film 13 can be placed within this mask to be partially exposed by these nine holes for manufacture of eight transducers which can then be cut from a single piece of film after fabrication thereon of the connections of the invention. When used as a mask, the cardboard mask is folded over and is clamped shut, for example by two wire-type paper clips oppositely disposed on the solid portion of the mask, and for example by five or nine cotter pins disposed about the eight smaller holes but not covering them.

It is preferred to produce more than one transducer at a time using a single sheet of polymer using such masks as those described above, and then to cut or trim the polymer film into individual transducers, so that the film can be more easily stretched and held flat during fabrication of the transducers.

Figure 6:
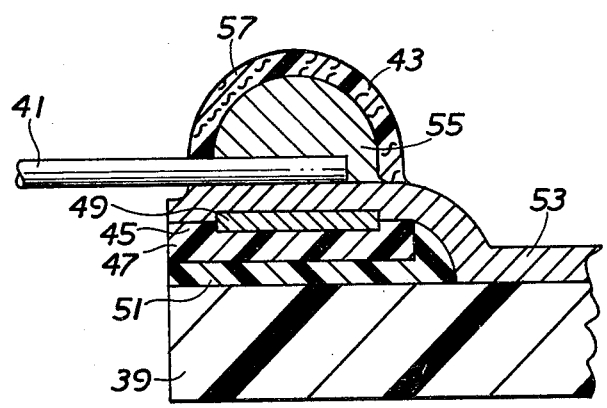
FIG. 6 is an enlarged sectional representation of another preferred embodiment of a connection according to the present invention, with some portions shown exaggerated for clarity.

There is shown in FIG. 6 a film 39 such as a polymter transducer film of $PVF_2$, and a wire 41, mechanically and electrically linked by an alternative preferred embodiment 43 of a connection according to the present invention. Connection 43 includes a solderable terminal or terminal strip 45. Terminal 45 includes an insulating tab 47 and a metallic conductive tab 49. For example, insulating tab 47 can be of synthetic resin polymer material such as Teflon ® film 0.004 inch thick, or of an epoxy/glass laminate 0.005 inch thick, or of fiberglass. For example, conductive tab 49 can be of copper foil 0.0014 inch thick electrodeposited onto or otherwise attached to insulating tab 47. Terminal strips CTF-75C, CTF-100C or CEG-75C terminal strips for strain gauges marketed by Micro-Measurements, Measurements Group, Vishay Intertechnology, Inc., Romulus, Michigan can be used for this purpose. See Micro-Measurements M-Line Accessories Bulletin A-138-3, December 1975, copyright 1975 by Micro-Measurements.

Terminal 45 is fixed to film 39 by epoxy or other adhesive 51. Epoxy cement is preferred for this purpose as adhesive 51. Other firm bonding adhesives can be used, preferably those which can withstand relatively high temperatures, but epoxy cement is preferred for this purpose. Conductive layer 53, which is preferably of gold, covers the exposed surface of tab 49 and at least a portion of the surface of film 39, depending on whether and what masking is used, and thereby electrically connects tab 49 and film 39. Gold is preferred as a transducer electrode and conducting attachment path because gold has a relatively high melting point and relatively high conductivity and is therefore less likely than for example aluminum to overheat and burn out, provides improved resistance to corrosion and environmental and chemical attack, and adheres well to epoxy. Wire 41 is electrically and mechanically connected to conductive coating 53 above tab 49 with solder 55. Solder 55 is preferably low temperature solder, for example 50 percent indium-50 percent tin solder or 80 percent indium-5 percent silver-15 percent lead solder which have been used successfully with rosin and regular non-acid flux. Inclusion of a thermally insulating tab 47 between film 39 and the copper soldering tab 49, coupled with the use of low temperature solder 55, permits wire 41 to be soldered to film 39 without thermal damage to the film. Applied solder 55 is preferably coated with silver-filled paint which can for example be of silver powder dispersed in a cellulose acetate or epoxy base. Silver paint overcoating 57 provides a lower current density and lower contact resistance in the vicinity of the contact.

A transducer similar to that of FIGS. 1 and 2 but including connections as in FIG. 6 can be produced using the following method. If film 39 is provided from the manufacturer with a metallic coating such as of aluminum, this coating is first removed from the surface of film 39 to help insure a good mechanical connection between film 39 and terminal 45. As discussed above for fabricating the connection of FIG. 4, this coating is etched away using a sodium hydroxide solution, and the film 39 is then rinsed in distilled water or organic solvents such as methanol or acetone and thereafter dried. This step need not be practiced if film 39 is not so coated. Film 39 is then masked as shown in FIGS. 3–5 for film 13 and discussed above in the formation of the connections of FIG. 4. At a desired terminal location, a terminal strip 45 is cemented onto film 39 using epoxy cement or other adhesive 51. Since terminal 45 is flat, it can be securely bonded to film 39 with a thin glue line, and pressure pads can be used in the gluing process. This attachment should be accomplished in such a manner as to leave the upper portion of conductive tab 49 exposed. An approximately 2000 angstrom thick layer of gold or other metal is then vacuum deposited such as by sputtering onto the masked film 39 and terminal 45. Wire 41 or some other electrical contact is then soldered onto the gold coated or otherwise conductively coated 53 copper pad 49, preferably using low temperature solder as solder 55. Solder 55 and wire 41 can then be overcoated with epoxy or preferably with silver filled paint 57 to provide further protection, improved heat dissipation, and in the case of silver filled paint, added assurance of conductivity. Masks 35 and 37 can be removed at any time following application of conductive metallic film 53, but can be used as a convenient vise for film 39 during application of solder 55 and overcoating 57. However, for some applications it may be desirable to remove masks 35 and 37 before application of solder 55 and overcoating 57.

PVF$_2$ film usable in the transducers of the present invention has been available from Kureha Corporation, New York, N.Y., and is available from Pennwalt Corporation, King of Prussia, Pennsylvania.

In summary, operation of the foregoing invention is as follows. A conductive element such as a wire or a solderable terminal or terminal strip is attached to a member using adhesive, preferably an adhesive such as epoxy which provides some thermal protection to the member. Except where the member is masked, the member is then coated with conductive material, preferably gold, to provide electrical interconnection between the member and the conductive element. If a terminal or terminal strip is used as the conductive element, a wire or other conductive element can now be soldered to the conductive coating at the terminal, and the resulting solder connection can then be overcoated with silver filled paint or epoxy. Otherwise, if a wire is used as the conductive element, the conductive coating in the vicinity of the wire can then be overcoated with epoxy or other conforming material which hardens to form a solid, heat-dissipative material. The adhesive material fastening the conductive element to the member provides a good mechanical connection therebetween and thus improves reliability of the electrical connection therebetween. The protective overcoating protects the electrical connection, ensures mechanical strength of the contact, and by its thermal conductivity helps to dissipate heat from the connection to prevent thermal damage to the member when relatively large amounts of current pass through the electrical interconnection. In addition, connections and electrodes according to the present invention can be applied to polymer film to form capacitors, or diaphragms such as for loudspeakers or earphones.

It should be understood that members or materials other than PVF$_2$ films can be provided with reliable electrical connections according to the present invention. Such connections can be used on other members than PVF$_2$ films, but are particularly valuable for other thermally sensitive circuit applications. Also, any desired number of connections can be provided to such a member if appropriate masking is used. To form transducer 11, the connections need not be placed on opposite ends of the film 13, but can for example be disposed on opposite sides of film 13 or 39 and at a 90° or other angle with respect to one another on the plane of the film, with the active area of the transducer at the vertex of that angle and displaced from the two connections to avoid anomalies. Any conductive material capable of adhering to the member, to the adhesive and to the conductive element and capable of being applied as a coating thereto can be utilized as or in conductive coatings 15, 17, and 53, although gold is preferred. Other conductive elements than wires 21, 23 and 41 or terminal 45 can be connected to a member such as film 13 or 39 according to the present invention. Masks 35 and 37 can be dispensed with if it is only desired to produce a strong, durable connection with low contact resistance to reduce localized heating of film 13 or 39 at high electrical loads, although masks 35 and 37 are necessary to form transducer electrodes such as are shown in FIGS. 1-5 and to prevent electrical interconnection between multiple connections. Multiple connections can be applied one at a time if desired.

Some of the many advantages of the invention should now be readily apparent. For example, a novel electrical connection has been provided which is capable of providing strong, reliable mechanical and electrical interconnection between a conductive element and a separate member. The use of sputtered gold for the conductive coating and electrodes provides a coating which has good adherence to a PVF$_2$ substrate and to adhesives and which is better able to sustain the high power levels incurred during pulsing of transducer 11 than would for example aluminum. A transducer is thereby provided with lead attachment points relatively remote from the active area, preventing high fields (e.g. $0.2 \times 10^6$ volts/cm.) from building up near lead attachment points. Such fields can produce arcing and subsequent burnout near the lead attachment points. Adhesive lead attachment avoids the use of soldering which damages PVF$_2$ and also avoids the use of metal-filled conducting adhesives which tend to burn up under high current load and in high fields, and provide a weaker mechanical bond than do nonfilled adhesives. As can be seen more clearly in FIGS. 1 and 3, masks 35 and 37 keep the conductive coating away from the edges of the produced transducer 11 to prevent arcing between the plates of the transducer. Displacing the active area from the electrical connections also maintains the field of the active area away from electrical or acoustic anomalies produced by the lead attachment point.

For further information, see Bloomfield, P. E. *Piezoelectric Polymer Transducers for Detection of Structural Defects in Aircraft* (N.T.I.S. Accession No. AD-A055 729/8GA, abstracted Sept. 29, 1978) and Scott, W. R. and Bloomfield, P. E., *Durable Lead Attachment Techniques for PVDF Polymer Transducers with Application to Ultrasonics.* In 1979 *SAF Symposium Digest: International IEEE Sumposium on Applications of Ferroelectrics,* June 13–15, 1979, Session 14.6, p. 92, June 15; sponsored by The Group on Sonics and Ultrasonics of the Institute of Electrical and Electronic Engineers et al.

Obviously, many modifications and variations of the present invention are possible in light of the above teachings. It is therefore to be understood that, within the scope of the appended claims, the invention may be practiced otherwise than as specifically described.

What is claimed is:

1. A connection, comprising:
   a first conductive member;
   a second member consisting of polyvinylidene fluoride;
   an epoxy adhesive material disposed between and attaching said first conductive member to said second member; and
   a first electrically conductive coating on adjacent portions of said first conductive member and said second member for electrically connecting said first conductive member and said second member.

2. A connection as recited in claim 1 wherein said first conductive member comprises a thermally insulating terminal.

3. A connection as recited in claim 2 wherein said terminal comprises copper foil electrodeposited onto a synthetic resin polymer film.

4. A connection as recited in claim 2 wherein said terminal comprises copper foil electrodeposited onto an epoxy-glass laminate.

5. A connection as recited in claim 2, further comprising: a metallic wire; and low temperature solder connecting said wire and said conductive coating at said terminal.

6. A connection as recited in claim 5, further comprising: a second electrically conductive coating on said solder.

7. A connection as recited in claim 6, wherein said second conductive coating comprises silver-filled paint.

8. A device comprising:
a piezoelectric substrate consisting of polyvinylidene fluoride;
first and second electrically conductive members;
an epoxy adhesive material attaching said conductive members to said substrate at respective opposite first and second surfaces and near respective opposite ends about an active region of said substrate;
a first conductive contiguous coating on a portion of said first conductive member and an adjacent portion of said first side surface of said substrate; and
a second contiguous electrically conductive coating on a portion of said second side surface of said substrate;
whereby said first and second conductive coatings define therebetween the active region of said substrate.

9. A connection, comprising:
a first conductive thermally insulating terminal member;
a second member;
adhesive member dispoed between and attaching said terminal member to said second member;
a first electrically conductive coating on adjacent portions of said terminal member and said second member for electrically connecting said terminal member and said second member;
a metallic wire;
a low temperature solder connecting said wire and said first conductive coating at said terminal member; and
a second electrically conductive coating on said solder.

10. A connection as recited in claim 9, wherein said second conductive coating comprises silver-filled paint.

11. A connection as recited in claim 9 wherein said terminal comprises copper foil electrodeposited onto a synthetic resin polymer film.

12. A connection as recited in claim 9 wherein said terminal comprises copper foil electrodeposited onto an epoxy-glass laminate.

* * * * *